(12) United States Patent
Jeong

(10) Patent No.: US 9,627,083 B1
(45) Date of Patent: Apr. 18, 2017

(54) NONVOLATILE MEMORY DEVICES RELATING TO OPERATION RANGES

(71) Applicant: SK hynix Inc., Icheon-si, Gyeonggi-do (KR)

(72) Inventor: Hoe Sam Jeong, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 15/219,906

(22) Filed: Jul. 26, 2016

(30) Foreign Application Priority Data

Apr. 11, 2016 (KR) .......................... 10-2016-0044099

(51) Int. Cl.
*G11C 16/26* (2006.01)
*G11C 16/04* (2006.01)

(52) U.S. Cl.
CPC .......... *G11C 16/26* (2013.01); *G11C 16/0408* (2013.01)

(58) Field of Classification Search
CPC ........................... G11C 16/26; G11C 16/0408
See application file for complete search history.

(56) References Cited

U.S. PATENT DOCUMENTS

| | | | | |
|---|---|---|---|---|
| 6,525,967 B1* | 2/2003 | Briner | .................... | G11C 7/062 365/185.21 |
| 6,618,313 B2* | 9/2003 | Nguyen | ................... | G11C 7/22 365/194 |
| 6,788,581 B2* | 9/2004 | Mihara | .................. | G11C 16/24 365/185.21 |
| 7,345,512 B2* | 3/2008 | Tran | ....................... | G11C 7/062 327/52 |

FOREIGN PATENT DOCUMENTS

KR    1020100097891 A    9/2010

* cited by examiner

*Primary Examiner* — Tri Hoang
(74) *Attorney, Agent, or Firm* — William Park & Associates Ltd.

(57) ABSTRACT

A nonvolatile memory device may include a nonvolatile memory cell and a sensing circuit. The sensing circuit is coupled to a bit line of the nonvolatile memory cell. The sensing circuit may be realized using an inverter comprised of a P-channel transistor coupled to a supply voltage line and an N-channel transistor coupled to a ground voltage. The gate of the P-channel transistor is coupled to the ground voltage.

17 Claims, 16 Drawing Sheets

NONVOLATILE MEMORY DEVICES RELATING TO OPERATION RANGES

CROSS-REFERENCE TO RELATED APPLICATIONS

The present application claims priority under 35 U.S.C 119(a) to Korean Patent Application No. 10-2016-0044099, filed on Apr. 11, 2016, which is herein incorporated by references in its entirety.

BACKGROUND

1. Technical Field

Various embodiments of the present disclosure may generally relate to nonvolatile memory devices and, more particularly, to nonvolatile memory (NVM) devices relating to an operation range.

2. Related Art

Semiconductor memory devices are typically categorized as random access memory (RAM) devices or read only memory (ROM) devices according to data volatility thereof. The RAM devices lose stored data when power supplies are interrupted. In contrast, the ROM devices retain stored data when power supplies are interrupted. The ROM devices may also be classified as programmable ROM (PROM) devices or mask ROM devices according to data input methods, that is, data program methods. The PROM devices may be fabricated and distributed without a program and thus are directly programmed by customers (i.e., users) after fabrication thereof. The mask ROM devices may be programmed during fabrication thereof using implantation masks manufactured based on data requested by users. The PROM devices may include one-time PROM (OTPROM) devices, erasable PROM (EPROM) devices and electrically erasable PROM (EEPROM) devices. Once the OTPROM devices are programmed, the programmed data of the OTPROM devices cannot be changed.

N-channel transistors or P-channel transistors may be used as cell transistors of the nonvolatile memory devices, for example, the OTPROM devices. If P-channel transistors are used as the cell transistors of the nonvolatile memory devices, the P-channel cell transistors may have a turn-off status as an initial status thereof and may have a turn-on status as a programmed status thereof. A read operation of the P-channel cell transistors may be executed by sensing a voltage level of a bit line connected to any one selected from the P-channel cell transistors. In such a case, the voltage level of the bit line may be determined by a resistance ratio of a resistance value of a load resistor coupled between a supply voltage line and the bit line and an equivalent resistance of the selected P-channel cell transistor. As electronic systems are scaled down and classified into more diverse systems, more supply voltage levels are required to operate the nonvolatile memory devices employed in the electronic systems. In such cases, the read operation of the nonvolatile memory devices employing the P-channel transistors as the cell transistors may be unstably executed. As a result, an operation range of the nonvolatile memory devices may be limited according to a magnitude of the supply voltage.

SUMMARY

According to an embodiment, a nonvolatile memory device may be provided. The nonvolatile memory device may include a nonvolatile memory cell and a sensing circuit. The sensing circuit is coupled to a bit line of the nonvolatile memory cell. The sensing circuit may be realized using an inverter comprised of a P-channel transistor coupled to a supply voltage line and an N-channel transistor coupled to a ground voltage. The gate of the P-channel transistor is coupled to the ground voltage.

DETAILED DESCRIPTION

In the following description of the embodiments, it will be understood that the terms "first" and "second" are intended to identify an element, but not used to define only the element itself or to mean a particular sequence. In addition, when an element is referred to as being located "on", "over", "above", "under" or "beneath" another element, it is intended to mean relative position relationship, but not used to limit certain cases that the element directly contacts the other element, or at least one intervening element is present therebetween. Accordingly, the terms such as "on", "over", "above", "under", "beneath", "below" and the like that are used herein are for the purpose of describing particular embodiments only and are not intended to limit the scope of the present disclosure. Further, when an element is referred to as being "connected" or "coupled" to another element, the element may be electrically or mechanically connected or coupled to the other element directly, or may form a connection relationship or coupling relationship by replacing the other element therebetween.

Various embodiments may be directed to nonvolatile memory devices having a wide operation range.

Figure 1:
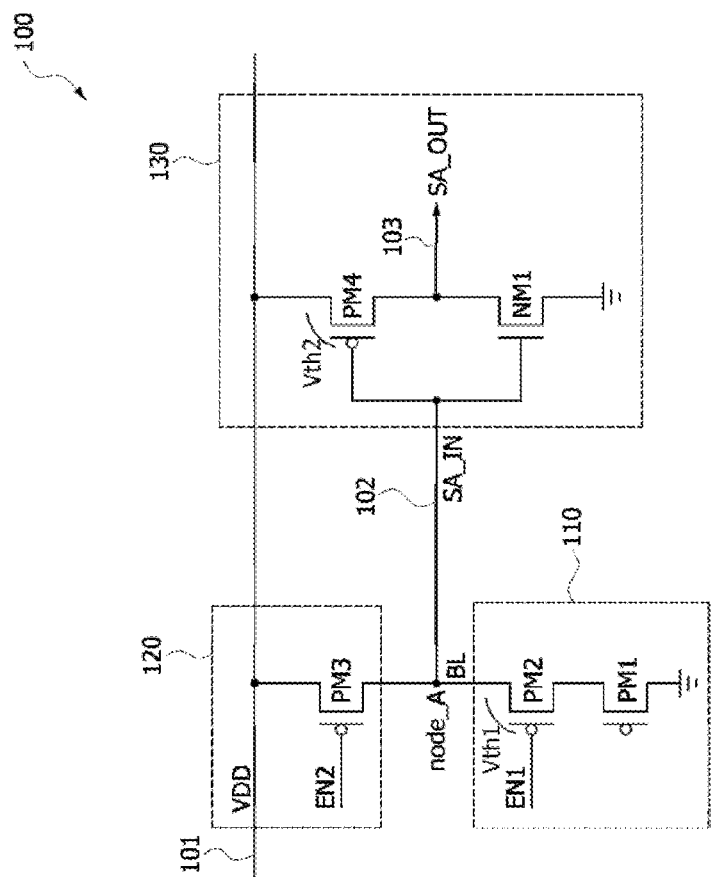
FIG. 1 is a circuit diagram illustrating a general nonvolatile memory device.

FIG. 1 is a circuit diagram illustrating a general nonvolatile memory (NVM) device 100. Referring to FIG. 1, the NVM device 100 may be configured to include an NVM cell 110, a resistive load portion 120 and a sensing circuit 130. The NVM cell 110 may be configured to include a first P-channel transistor PM1 acting as a cell transistor and a second P-channel transistor PM2 acting as a selection transistor. A gate of the first P-channel transistor PM1 may correspond to a floating gate, and a drain of the first P-channel transistor PM1 may be coupled to a ground voltage terminal. A source of the first P-channel transistor PM1 may be directly coupled to a drain of the second P-channel transistor PM2. A first enablement signal EN1 acting as a selection signal may be applied to a gate of the second P-channel transistor PM2. A source of the second P-channel transistor PM2 may be coupled to a first node node_A through a bit line BL.

The resistive load portion 120 may include a resistive load element coupled between a supply voltage line 101 and the first node node_A. In some embodiments, the resistive load element may be realized using a third P-channel transistor PM3. A second enablement signal EN2 may be applied to a gate of the third P-channel transistor PM3. A source and a drain of the third P-channel transistor PM3 may be coupled to the supply voltage line 101 and the first node node_A, respectively. If the third P-channel transistor PM3 is turned on, the third P-channel transistor PM3 may act as a resistive element coupled between the supply voltage line 101 and the first node node_A.

The sensing circuit 130 may be realized using a complementary metal-oxide-semiconductor (CMOS) inverter comprised of a first N-channel transistor NM1 and a fourth P-channel transistor PM4. A gate of the first N-channel transistor NM1 and a gate of the fourth P-channel transistor PM4 may be coupled to the first node node_A through a sensing input line 102 that transmits a sensing input signal SA_IN. A source of the first N-channel transistor NM1 may be coupled to the ground voltage terminal. A drain of the first N-channel transistor NM1 may be coupled to a drain of the fourth P-channel transistor PM4. A source of the fourth P-channel transistor PM4 may be coupled to the supply voltage line 101 that transmits a supply voltage VDD. The drains of the first N-channel transistor NM1 and the fourth P-channel transistor PM4 may be coupled to a sensing output line 103 through which a sensing output signal SA_OUT is outputted.

The first P-channel transistor PM1 acting as a cell transistor may have an initial status or a programmed status. In various embodiments, the initial status may mean an off-cell status that the first P-channel transistor PM1 is turned off and the programmed status may mean an on-cell status that the first P-channel transistor PM1 is turned on. In order to read out the status of the first P-channel transistor PM1, the first enablement signal EN1 may be applied to the gate of the second P-channel transistor PM2 to turn on the second P-channel transistor PM2. The second enablement signal EN2 may be applied to the gate of the third P-channel transistor PM3 to turn of the third P-channel transistor PM3. In such a case, a bit line voltage that remains after subtracting a voltage drop across the third P-channel transistor PM3, which is turned on, from the supply voltage VDD applied to the supply voltage line 101 may be induced at the first node node_A. The bit line voltage may correspond to the sensing input signal SA_IN, and the sensing input signal SA_IN may be inputted to the sensing circuit 130.

If the first P-channel transistor PM1 has an initial status corresponding to an off-cell status, the first node node_A may have a voltage which is substantially equal to the supply voltage VDD because an equivalent resistance of the first P-channel transistor PM1 is much higher than an equivalent resistance of the third P-channel transistor PM3 which is turned on. That is, the sensing input signal SA_IN may have a voltage level of the supply voltage VDD. If the sensing input signal SA_IN having the supply voltage VDD is inputted to the sensing circuit 130, the first N-channel transistor NM1 may be turned on while the fourth P-channel transistor PM4 is not fully turned on. As a result, the sensing circuit 130 may output a ground voltage as the sensing output signal SA_OUT because the first N-channel transistor NM1 is turned on. As such, if a ground voltage is outputted as the sensing output signal SA_OUT of the sensing circuit 130, the first P-channel transistor PM1 acting as a cell transistor may be regarded as having an initial status.

If the first P-channel transistor PM1 has a programmed status corresponding to an on-cell status, the first node node_A may have a voltage which is substantially equal to a ground voltage because an equivalent resistance between the first node node_A and the ground terminal is relatively lower than an equivalent resistance of the third P-channel transistor PM3 which is turned on. That is, the sensing input signal SA_IN may have a ground voltage. If the sensing input signal SA_IN having a ground voltage is inputted to the sensing circuit 130, the fourth P-channel transistor PM4 may be turned on while the first N-channel transistor NM1 is not fully turned on. As a result, the sensing circuit 130 may output the supply voltage VDD as the sensing output signal SA_OUT because the fourth P-channel transistor PM4 is turned on. As such, if the supply voltage VDD is outputted as the sensing output signal SA_OUT of the sensing circuit 130, the first P-channel transistor PM1 acting as a cell transistor may be regarded as having a programmed status.

If the supply voltage VDD has a relatively low voltage level, a read operation of the first P-channel transistor PM1 having a programmed status may not be successfully performed. For example, both of the second P-channel transistor PM2 acting as a selection transistor and the fourth P-channel transistor PM4 of the sensing circuit 130 should be turned on in order that the first P-channel transistor PM1 is regarded as a programmed cell transistor. In order to turn on the second P-channel transistor PM2, a voltage difference between the gate and the source of the second P-channel transistor PM2 should be greater than an absolute value of a threshold voltage (hereinafter, also referred to as a first threshold voltage Vth1) of the second P-channel transistor PM2. In order to turn on the fourth P-channel transistor PM4, a voltage difference between the gate and the source of the fourth P-channel transistor PM4 should be greater than an absolute value of a threshold voltage (hereinafter, also referred to as a second threshold voltage Vth2) of the fourth P-channel transistor PM4. Thus, in order to turn on both of the second and fourth P-channel transistors PM2 and PM4, the supply voltage VDD should be greater than an absolute value of a sum of the first and second threshold voltages Vth1 and Vth2 under the assumption that a voltage drop due to an equivalent resistance of the third P-channel transistor PM3 is neglected. That is, if a magnitude of the supply voltage VDD is less than an absolute value of a sum of the first and second threshold voltages Vth1 and Vth2, a read operation of the first P-channel transistor PM1 having a programmed status may be abnormally executed to cause malfunction of the NVM device 100.

Figure 2:
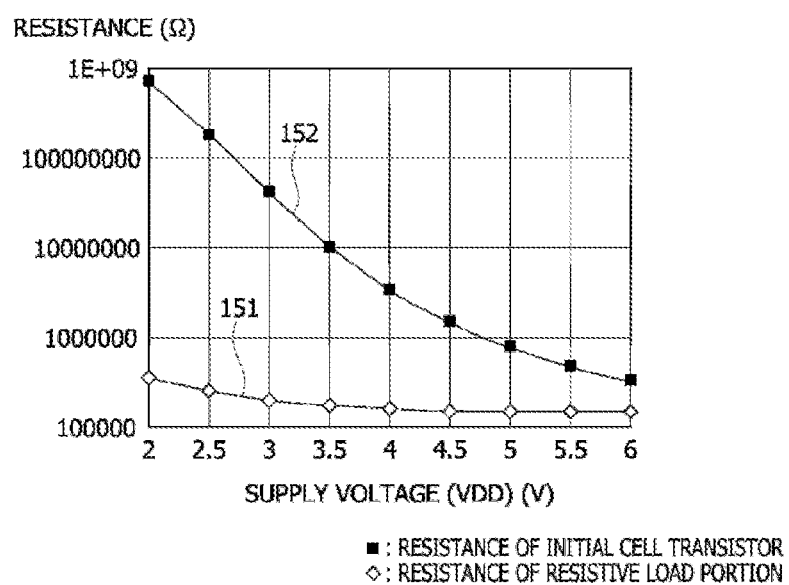
FIG. 2 is a graph illustrating resistance values of a cell transistor and a resistive load portion of the nonvolatile memory device illustrated in FIG. 1 as a function of a supply voltage when the cell transistor has an initial status.

FIG. 2 is a graph illustrating resistance values of the P-channel transistor PM1 or cell transistor and the resistive load portion 120 of the NVM device 100 illustrated in FIG. 1 as a function of the supply voltage VDD (V) when the cell transistor PM1 has an initial status. Referring to FIGS. 1 and 2, as can be seen from data plotted by a reference numeral "151", a resistance value of the third P-channel transistor PM3 constituting the resistive load portion 120 may be almost constant even though the supply voltage VDD varies. As can be seen from data plotted by a reference numeral "152", a resistance value of the first P-channel transistor PM1 (acting as a cell transistor) having an initial status is abruptly reduced as the supply voltage VDD increases. Thus, a difference between a resistance value of the first P-channel transistor PM1 and a resistance value of the third P-channel transistor PM3 may gradually increase if the supply voltage VDD is reduced, whereas a difference between a resistance value of the first P-channel transistor PM1 and a resistance value of the third P-channel transistor PM3 may be gradually reduced if the supply voltage VDD increases.

As described with reference to FIG. 1, the sensing input signal SA_IN may correspond to a signal outputted through the first node node_A. That is, the sensing input signal SA_IN may have a voltage level of the first node node_A. A voltage level of the first node node_A may be determined by voltage division which is based on a ratio of a resistance of the first P-channel transistor PM1 to a resistance of the third P-channel transistor PM3. If the supply voltage VDD is reduced, the sensing input signal SA_IN may have a voltage level which is close to the supply voltage VDD because a ratio of a resistance value of the first P-channel transistor PM1 having an initial status to a resistance value of the third P-channel transistor PM3 increases. Thus, a read operation of the first P-channel transistor PM1 having an initial status may be successfully performed at a low supply voltage VDD. If the supply voltage VDD increases, a voltage level of the sensing input signal SA_IN may be low as compared with the increased supply voltage VDD because a ratio of a resistance value of the first P-channel transistor PM1 having an initial status to a resistance value of the third P-channel transistor PM3 is reduced. Thus, a read operation of the first P-channel transistor PM1 having an initial status may be abnormally performed at a high supply voltage VDD. As a result, if the supply voltage VDD increases, a read margin of the first P-channel transistor PM1 having an initial status may be reduced.

Figure 3:
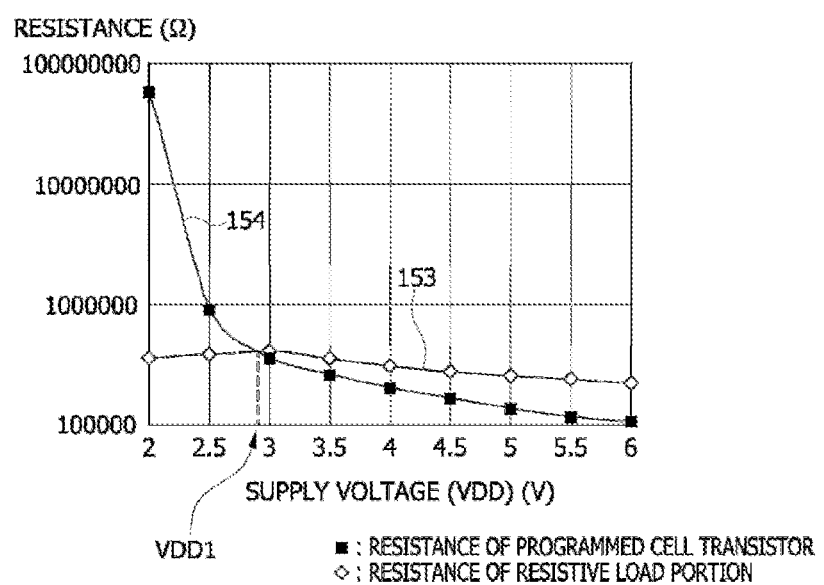
FIG. 3 is a graph illustrating resistance values of a cell transistor and a resistive load portion of the nonvolatile memory device illustrated in FIG. 1 as a function of a supply voltage when the cell transistor has a programmed status.

FIG. 3 is a graph illustrating resistance values of the cell transistor PM1 and the resistive load portion 120 of the NVM device 100 illustrated in FIG. 1 as a function of the supply voltage VDD when the cell transistor PM1 has a programmed status. Referring to FIGS. 1 and 3, as can be seen from data plotted by a reference numeral "153", a resistance value of the third P-channel transistor PM3 constituting the resistive load portion 120 may be almost constant even though the supply voltage VDD varies. As can be seen from data plotted by a reference numeral "154", a resistance value of the first P-channel transistor PM1 (acting as a cell transistor) having a programmed status may increase as the supply voltage VDD is reduced. If the supply voltage VDD becomes lower than a certain supply voltage VDD1, a resistance value of the first P-channel transistor PM1 may increase to be greater than a resistance value of the third P-channel transistor PM3 and may increase rapidly.

If the supply voltage VDD increases, a difference between a resistance value of the first P-channel transistor PM1 having a programmed status and a resistance value of the third P-channel transistor PM3 may gradually increase. Thus, the sensing input signal SA_IN may have a voltage level which is close to the ground voltage. Accordingly, a read operation of the first P-channel transistor PM1 having a programmed status may be successfully performed at a high supply voltage VDD. However, if the supply voltage VDD is reduced, a difference between a resistance value of the first P-channel transistor PM1 having a programmed status and a resistance value of the third P-channel transistor PM3 may also be reduced. Accordingly, a read operation of the first P-channel transistor PM1 having a programmed status may be abnormally performed at a low supply voltage VDD. In addition, if the supply voltage VDD is continuously reduced to be lower than a certain supply voltage VDD1, a resistance value of the first P-channel transistor PM1 having a programmed status may be greater than a resistance value of the third P-channel transistor PM3. In such a case, during a read operation, the first P-channel transistor PM1 having a programmed status may be regarded as an initial cell transistor which is not programmed. As a result, if the supply voltage VDD is lowered, a read margin of the first P-channel transistor PM1 having a programmed status may be reduced.

As described above, in case of the general NVM device 100, if the supply voltage VDD is lower than a sum of the first threshold voltage Vth1 of the second P-channel transistor PM2 acting as a selection transistor of the NVM cell 110 and the second threshold voltage Vth2 of the fourth P-channel transistor PM4 of the sensing circuit 130, a read operation of the NVM cell 110 may be abnormally performed. Accordingly, there may be a limitation in lowering the supply voltage VDD. Furthermore, if the first P-channel transistor PM1 has an initial status, a read margin of the NVM cell 110 may be reduced as the supply voltage VDD increases. Moreover, if the first P-channel transistor PM1 has a programmed status, a read margin of the NVM cell 110 may be reduced as the supply voltage VDD is lowered. That is, a read margin of the initial cell transistor and a read margin of the programmed cell transistor may have a trade-off relationship according to the supply voltage VDD.

Figure 4:
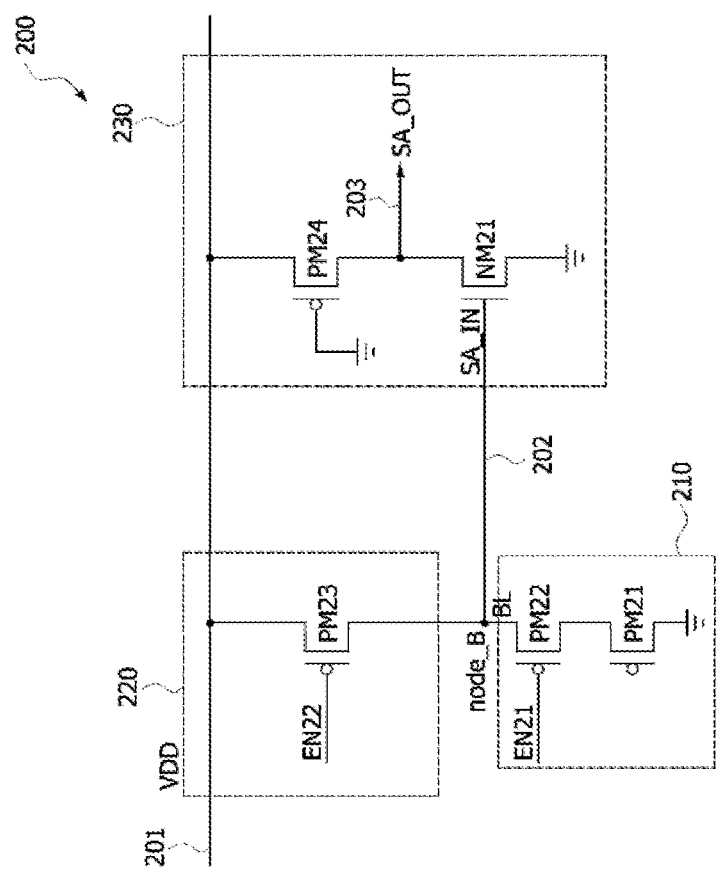
FIG. 4 is a circuit diagram illustrating a representation of an example of a nonvolatile memory device according to an embodiment.

FIG. 4 is a circuit diagram illustrating a nonvolatile memory (NVM) device 200 according to an embodiment of the present disclosure. Referring to FIG. 4, the NVM device 200 may be configured to include an NVM cell 210, a resistive load portion 220 and a sensing circuit 230. The NVM cell 210 may be configured to include a first P-channel transistor PM21 acting as a cell transistor and a second P-channel transistor PM22 acting as a selection transistor. A gate of the first P-channel transistor PM21 may correspond to a floating gate, and a drain of the first P-channel transistor PM21 may be coupled to a ground voltage terminal. A source of the first P-channel transistor PM21 may be directly coupled to a drain of the second P-channel transistor PM22. A first enablement signal EN21 acting as a selection signal may be applied to a gate of the second P-channel transistor PM22. A source of the second P-channel transistor PM22 may be coupled to a first node node_B through a bit line BL.

The resistive load portion 220 may include a resistive load element coupled between a supply voltage line 201 and the first node node_B. In some embodiments, the resistive load element may be realized using a third P-channel transistor PM23. A second enablement signal EN22 may be applied to a gate of the third P-channel transistor PM23. A source and a drain of the third P-channel transistor PM23 may be coupled to the supply voltage line 201 and the first node node_B, respectively. If the third P-channel transistor PM23 is turned on, the third P-channel transistor PM23 may act as a resistive element coupled between the supply voltage line 201 and the first node node_B.

The sensing circuit 230 may be realized using an inverter structure comprised of a first N-channel transistor NM21 and a fourth P-channel transistor PM24. A gate of the first N-channel transistor NM21 may receive a sensing input signal SA_IN through a sensing input line 202. The sensing input line 202 may be coupled to the first node node_B, that is, the bit line BL. A source of the first N-channel transistor NM21 may be coupled to the ground voltage terminal. A drain of the first N-channel transistor NM21 may be coupled to a drain of the fourth P-channel transistor PM24. A source of the fourth P-channel transistor PM24 may be coupled to the supply voltage line 201 that transmits a supply voltage VDD. A gate of the fourth P-channel transistor PM24 may be grounded through the ground voltage terminal. Thus, the fourth P-channel transistor PM24 may be always turned on regardless of the sensing input signal SA_IN. The drains of the first N-channel transistor NM21 and the fourth P-channel transistor PM24 may be coupled to a sensing output line 203 through which a sensing output signal SA_OUT is outputted.

The first N-channel transistor NM21 may have a transconductance (gm) which is higher than a transconductance (gm) of the fourth P-channel transistor PM24. That is, a channel length of the first N-channel transistor NM21 may be less than a channel length of the fourth P-channel transistor PM24, or a channel width of the first N-channel transistor NM21 may be greater than a channel width of the fourth P-channel transistor PM24. Since the transconductance (gm) of the first N-channel transistor NM21 is higher than the transconductance (gm) of the fourth P-channel transistor PM24, a resistance value of the first N-channel transistor NM21 may be less than a resistance value of the fourth P-channel transistor PM24 if both of the first N-channel transistor NM21 and the fourth P-channel transistor PM24 are turned on. Thus, if both of the first N-channel transistor NM21 and the fourth P-channel transistor PM24 are turned on, the sensing output signal SA_OUT outputted through the sensing output line 203 may have a low voltage level (i.e., a logic "low" level) which is close to the ground voltage.

Figure 5:
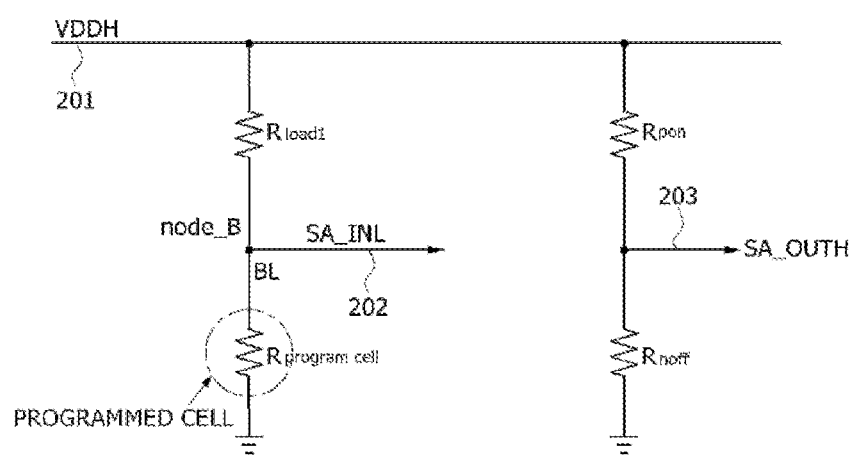
FIG. 5 is an equivalent circuit diagram of the nonvolatile memory device illustrated in FIG. 4 for illustrating a read operation of a programmed cell transistor included in the nonvolatile memory device when a high supply voltage is applied to the nonvolatile memory device.

FIG. 5 is an equivalent circuit diagram of the NVM device 200 illustrated in FIG. 4 for illustrating a read operation of a programmed cell transistor included in the NVM device 200 when a high supply voltage VDDH is applied to the NVM device 200. Referring FIGS. 4 and 5, in order to execute a read operation of the NVM device 200, a low signal having a voltage level close to or equal to the ground voltage may be provided as the first and second enablement signals EN21 and EN22 to turn on both of the second P-channel transistor PM22 acting as a selection transistor and the third P-channel transistor PM23 acting as a resistive load element. The NVM cell 210 coupled between the first node node_B and the ground voltage terminal may be expressed as a first equivalent resistor $R_{program\ cell}$. The third P-channel transistor PM23 coupled between the supply voltage line 201 and the first node node_B may be expressed as a second equivalent resistor $R_{load1}$. Since the first P-channel transistor PM21 has a programmed status corresponding to an on-cell status, the first equivalent resistor $R_{program\ cell}$ may have a relatively low resistance value as compared with the second equivalent resistor $R_{load1}$. Thus, the first node node_B may have a voltage level which is close to the ground voltage. The voltage level of the first node node_B may provide a low sensing input signal SA_INL having a low level, and the low sensing input signal SA_INL may be applied to the gate of the first N-channel transistor NM21 of the sensing circuit 230 through the sensing input line 202.

As the low sensing input signal SA_INL having a low level is applied to the gate of the first N-channel transistor NM21, the first N-channel transistor NM21 may be turned off. Thus, the first N-channel transistor NM21 of the sensing circuit 230 may be expressed as a third equivalent resistor $R_{noff}$ having a high resistance value. Since the fourth P-channel transistor PM24 of the sensing circuit 230 is always turned on regardless of the low sensing input signal SA_INL having a low level, the fourth P-channel transistor PM24 may be expressed as a fourth equivalent resistor $R_{pon}$ having a low resistance value. Since the fourth equivalent resistor $R_{pon}$ has a relatively low resistance value as compared with the third equivalent resistor $R_{noff}$, a high sensing output signal SA_OUTH having a high level close to the high supply voltage VDDH may be outputted through the sensing output line 203 which is branched from a node between the third and fourth equivalent resistors $R_{noff}$ and $R_{pon}$. Accordingly, the first P-channel transistor PM21 acting as a cell transistor of the NVM cell 210 may be regarded as a programmed cell transistor.

Figure 6:
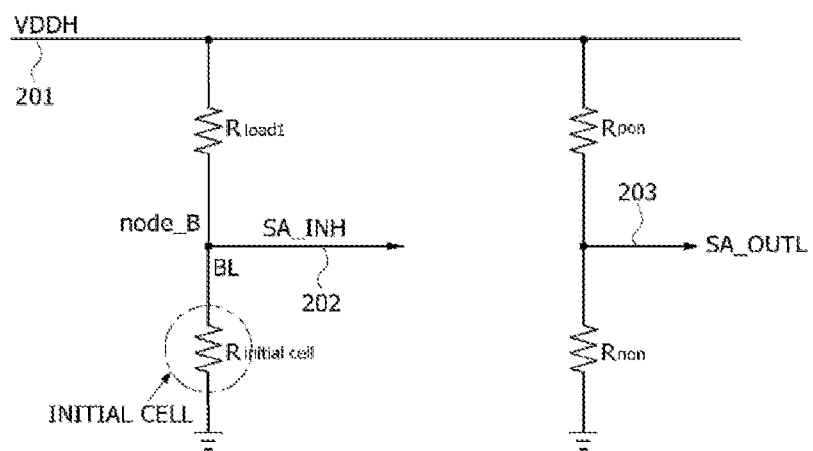
FIG. 6 is an equivalent circuit diagram of the nonvolatile memory device illustrated in FIG. 4 for illustrating a read operation of an initial cell transistor included in the nonvolatile memory device when a high supply voltage is applied to the nonvolatile memory device.

FIG. 6 is an equivalent circuit diagram of the NVM device 200 illustrated in FIG. 4 for illustrating a read operation of an initial cell transistor included in the NVM device 200 when a high supply voltage VDDH is applied to the NVM device 200. Referring FIGS. 4 and 6, in order to execute a read operation of the NVM device 200, a low signal having a voltage level close to or equal to the ground voltage may be provided as the first and second enablement signals EN21 and EN22 to turn on both of the second P-channel transistor PM22 acting as a selection transistor and the third P-channel transistor PM23 acting as a resistive load element. The NVM cell 210 coupled between the first node node_B and the ground voltage terminal may be expressed as a first equivalent resistor $R_{initial\ cell}$. The third P-channel transistor PM23 coupled between the supply voltage line 201 and the first node node_B may be expressed as a second equivalent resistor $R_{load1}$. Since the first P-channel transistor PM21 has an initial status corresponding to an off-cell status, the first equivalent resistor $R_{initial\ cell}$ may have a relatively high resistance value as compared with the second equivalent resistor $R_{load1}$. Thus, the first node node_B may have a voltage level which is close to the high supply voltage VDDH. The voltage level of the first node node_B may provide a high sensing input signal SA_INH having a high level, and the high sensing input signal SA_INH may be applied to the gate of the first N-channel transistor NM21 of the sensing circuit 230 through the sensing input line 202.

As the high sensing input signal SA_INH having a high level is applied to the gate of the first N-channel transistor NM21, the first N-channel transistor NM21 may be turned on. Thus, the first N-channel transistor NM21 of the sensing circuit 230 may be expressed as a third equivalent resistor $R_{non}$. Since the fourth P-channel transistor PM24 of the sensing circuit 230 is always turned on regardless of the high sensing input signal SA_INH having a high level, the fourth P-channel transistor PM24 may be expressed as a fourth equivalent resistor $R_{pon}$. Although both of the first N-channel transistor NM21 and the fourth P-channel transistor PM24 are turned on, a resistance value of the third equivalent resistor $R_{non}$ may be lower than a resistance value of the fourth equivalent resistor $R_{pon}$ because a transconductance of the first N-channel transistor NM21 is higher than a transconductance of the fourth P-channel transistor PM24. Thus, a low sensing output signal SA_OUTL having a low level close to the ground voltage rather than the high supply voltage VDDH may be outputted through the sensing output line 203 which is branched from a node between the third and fourth equivalent resistors $R_{non}$ and $R_{pon}$. Accordingly, the first P-channel transistor PM21 acting as a cell transistor of the NVM cell 210 may be regarded as an initial cell transistor.

Figure 7:
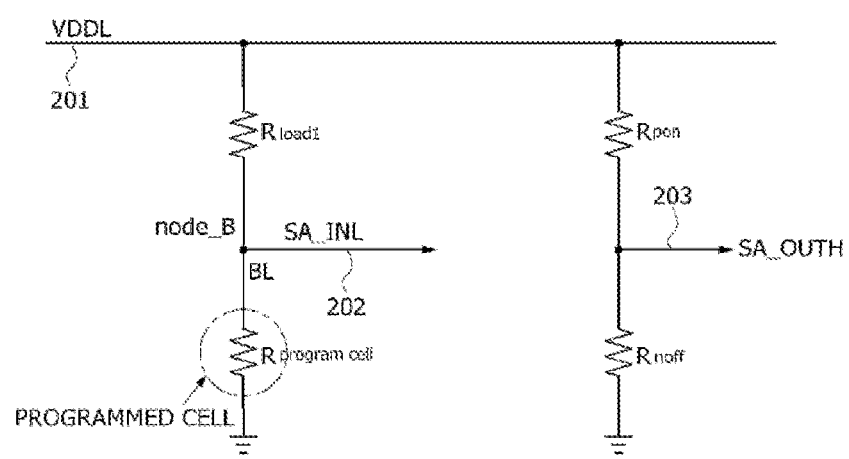
FIG. 7 is an equivalent circuit diagram of the nonvolatile memory device illustrated in FIG. 4 for illustrating a read operation of a programmed cell transistor included in the nonvolatile memory device when a low supply voltage is applied to the nonvolatile memory device.

FIG. 7 is an equivalent circuit diagram of the NVM device 200 illustrated in FIG. 4 for illustrating a read operation of a programmed cell transistor included in the NVM device 200 when a low supply voltage VDDL is applied to the NVM device 200. Referring FIGS. 4 and 7, in order to execute a read operation of the NVM device 200, a low signal having a voltage level close to or equal to the ground voltage may be provided as the first and second enablement signals EN21 and EN22 to turn on both of the second P-channel transistor PM22 acting as a selection transistor and the third P-channel transistor PM23 acting as a resistive load element. The NVM cell 210 coupled between the first node node_B and the ground voltage terminal may be expressed as a first equivalent resistor $R_{program\ cell}$. The third P-channel transistor PM23 coupled between the supply voltage line 201 and the first node node_B may be expressed as a second equivalent resistor $R_{load1}$. Since the first P-channel transistor PM21 has a programmed status corresponding to an on-cell status, the first equivalent resistor $R_{program\ cell}$ may have a relatively low resistance value as compared with the second equivalent resistor $R_{load1}$. Thus, the first node node_B may have a voltage level which is close to the ground voltage. The voltage level of the first node node_B may provide a low sensing input signal SA_INL having a low level, and the low sensing input signal SA_INL may be applied to the gate of the first N-channel transistor NM21 of the sensing circuit 230 through the sensing input line 202.

As the low sensing input signal SA_INL having a low level is applied to the gate of the first N-channel transistor NM21, the first N-channel transistor NM21 may be turned off. Thus, the first N-channel transistor NM21 of the sensing circuit 230 may be expressed as a third equivalent resistor $R_{noff}$ having a high resistance value. Since the fourth P-channel transistor PM24 of the sensing circuit 230 is always turned on regardless of the low sensing input signal SA_INL having a low level, the fourth P-channel transistor PM24 may be expressed as a fourth equivalent resistor $R_{pon}$ having a low resistance value. Since the fourth equivalent resistor $R_{pon}$ has a relatively low resistance value as compared with the third equivalent resistor $R_{noff}$, a high sensing output signal SA_OUTH having a high level close to the low supply voltage VDDL may be outputted through the sensing output line 203 which is branched from a node between the third and fourth equivalent resistors $R_{noff}$ and $R_{pon}$. Accordingly, the first P-channel transistor PM21 acting as a cell transistor of the NVM cell 210 may be regarded as a programmed cell transistor.

If the low supply voltage VDDL is reduced to be lower than a certain supply voltage, the first N-channel transistor NM21 may be weakly turned on. The first N-channel transistor NM21 weakly turned on may have a resistance value which is higher than a resistance value of the fourth equivalent resistor $R_{pon}$. Thus, even in such a case, the high sensing output signal SA_OUTH having a high level close to the low supply voltage VDDL may be outputted through the sensing output line 203. Accordingly, the read operation of the NVM device 200 may be normally performed such that the first P-channel transistor PM21 acting as a cell transistor of the NVM cell 210 is still regarded as a programmed cell transistor.

In the read operation of the first P-channel transistor PM21 having a programmed status, it may be necessary to turn on the second P-channel transistor PM22 because the fourth P-channel transistor PM24 of the sensing circuit 230 is always turned on. That is, in order to turn on the second P-channel transistor PM22, a voltage over the first threshold voltage Vth1 corresponding to a threshold voltage of the second P-channel transistor PM22 should be applied between the gate and the source of the second P-channel transistor PM22. If the first enablement signal EN21 has the ground voltage, a voltage level of the first node node_B should be higher than the first threshold voltage Vth1 to turn on the second P-channel transistor PM22. Thus, under the assumption that a voltage drop due to the second equivalent resistor $R_{load1}$ (corresponding to an equivalent resistor of the third P-channel transistor PM3) is neglected, the read operation of the first P-channel transistor PM21 having a programmed status may be normally performed if the low supply voltage VDDL is higher than the first threshold voltage Vth1 corresponding to the threshold voltage of the second P-channel transistor PM22.

Figure 8:
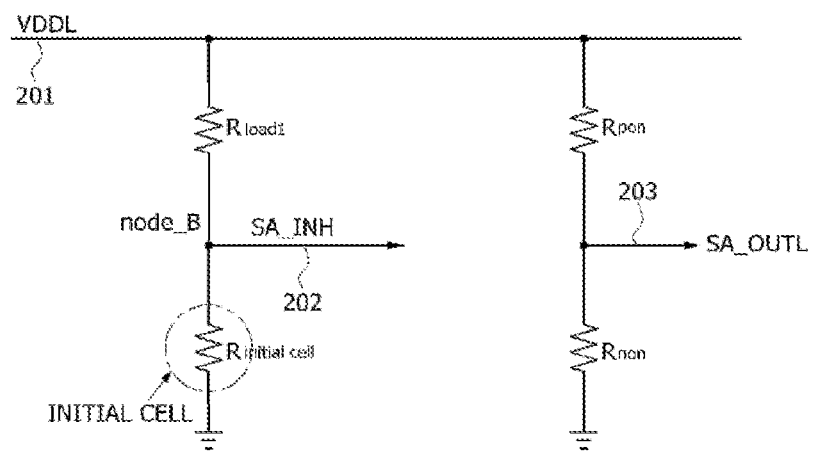
FIG. 8 is an equivalent circuit diagram of the nonvolatile memory device illustrated in FIG. 4 for illustrating a read operation of an initial cell transistor included in the nonvolatile memory device when a low supply voltage is applied to the nonvolatile memory device.

FIG. 8 is an equivalent circuit diagram of the NVM device 200 illustrated in FIG. 4 for illustrating a read operation of an initial cell transistor included in the NVM device 200 when a low supply voltage VDDL is applied to the NVM device 200. Referring FIGS. 4 and 8, in order to execute a read operation of the NVM device 200, a low signal having a voltage level close to or equal to the ground voltage may be provided as the first and second enablement signals EN21 and EN22 to turn on both of the second P-channel transistor PM22 acting as a selection transistor and the third P-channel transistor PM23 acting as a resistive load element. The NVM cell 210 coupled between the first node node_B and the ground voltage terminal may be expressed as a first equivalent resistor $R_{initial\ cell}$. The third P-channel transistor PM23 coupled between the supply voltage line 201 and the first node node_B may be expressed as a second equivalent resistor $R_{load1}$. Since the first P-channel transistor PM21 has an initial status corresponding to an off-cell status, the first equivalent resistor $R_{initial\ cell}$ may have a relatively high resistance value as compared with the second equivalent resistor $R_{load1}$. Thus, the first node node_B may have a voltage level which is close to the low supply voltage VDDL. The voltage level of the first node node_B may provide a high sensing input signal SA_INH having a high level, and the high sensing input signal SA_INH may be applied to the gate of the first N-channel transistor NM21 of the sensing circuit 230 through the sensing input line 202.

As the high sensing input signal SA_INH having a high level is applied to the gate of the first N-channel transistor NM21, the first N-channel transistor NM21 may be turned on. Thus, the first N-channel transistor NM21 of the sensing circuit 230 may be expressed as a third equivalent resistor $R_{non}$ having a relatively low resistance value. Since the fourth P-channel transistor PM24 of the sensing circuit 230 is always turned on regardless of the high sensing input signal SA_INH having a high level, the fourth P-channel transistor PM24 may be expressed as a fourth equivalent resistor $R_{pon}$ having a relatively low resistance value. Although both of the first N-channel transistor NM21 and the fourth P-channel transistor PM24 are turned on, a resistance value of the third equivalent resistor $R_{non}$ may be lower than a resistance value of the fourth equivalent resistor $R_{pon}$ because a transconductance of the first N-channel transistor NM21 is higher than a transconductance of the fourth P-channel transistor PM24. Thus, a low sensing output signal SA_OUTL having a low level close to the ground voltage rather than the low supply voltage VDDL may be outputted through the sensing output line 203 which is branched from a node between the third and fourth equivalent resistors $R_{non}$ and $R_{pon}$. Accordingly, the first P-channel transistor PM21 acting as a cell transistor of the NVM cell 210 may be regarded as an initial cell transistor.

Figure 9:
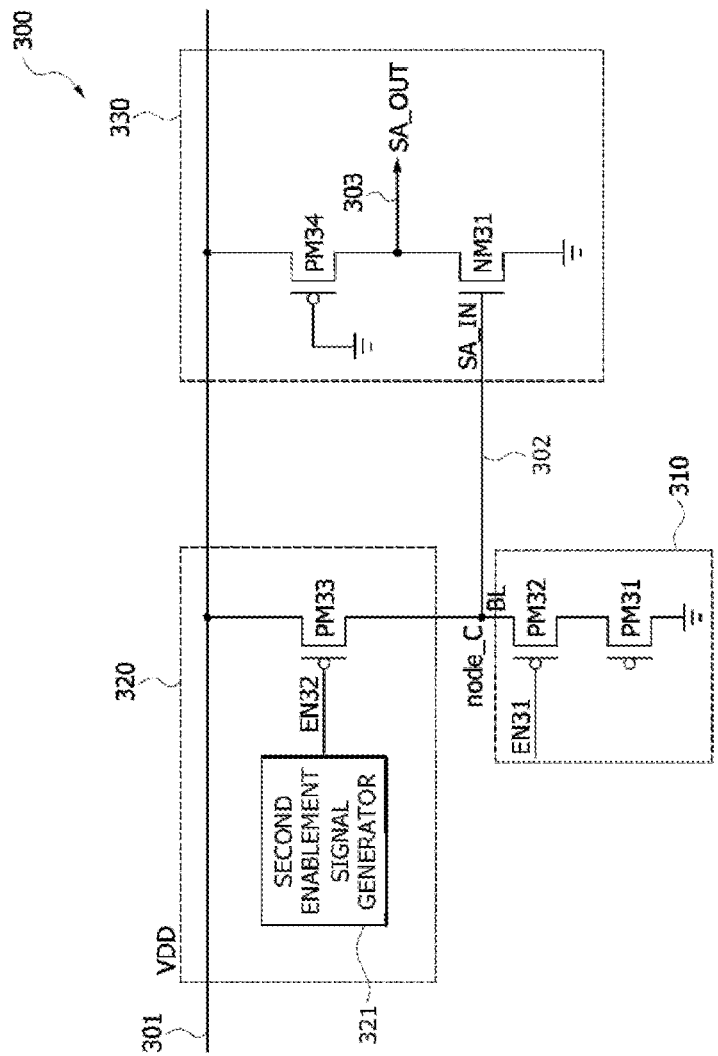
FIG. 9 is a circuit diagram illustrating a representation of an example of a nonvolatile memory device according to an embodiment.

FIG. 9 is a circuit diagram illustrating an NVM device 300 according to an embodiment of the present disclosure. Referring to FIG. 9, the NVM device 300 may be configured to include an NVM cell 310, a resistive load portion 320 and a sensing circuit 330. The NVM cell 310 may be configured to include a first P-channel transistor PM31 acting as a cell transistor and a second P-channel transistor PM32 acting as a selection transistor. A gate of the first P-channel transistor PM31 may correspond to a floating gate, and a drain of the first P-channel transistor PM31 may be coupled to a ground voltage terminal. A source of the first P-channel transistor PM31 may be directly coupled to a drain of the second P-channel transistor PM32. A first enablement signal EN31 acting as a selection signal may be applied to a gate of the second P-channel transistor PM32. A source of the second P-channel transistor PM32 may be coupled to a first node node_C through a bit line BL.

The resistive load portion 320 may include a resistive load element coupled between a supply voltage line 301 and the first node node_C. In some embodiments, the resistive load element may be realized using a third P-channel transistor PM33. A second enablement signal EN32 may be applied to a gate of the third P-channel transistor PM33. The second enablement signal EN32 may be generated from a second enablement signal generator 321. A source and a drain of the third P-channel transistor PM33 may be coupled to the supply voltage line 301 and the first node node_C, respectively. If the third P-channel transistor PM33 is turned on, the third P-channel transistor PM33 may act as a resistive element coupled between the supply voltage line 301 and the first node node_C.

The second enablement signal generator 321 may be configured to generate the second enablement signal EN32 applied to the gate of the third P-channel transistor PM33, and the third P-channel transistor PM33 may operate in a linear region or a saturation region according to a supply voltage VDD applied to the supply voltage line 301 and the second enablement signal EN32 applied to the gate of the third P-channel transistor PM33. A voltage level of the second enablement signal EN32 may vary according to a level of the supply voltage VDD. If a voltage difference between the gate and the source of the third P-channel transistor PM33 is equal to or greater than a critical voltage, the third P-channel transistor PM33 may operate in a linear region. In contrast, if the voltage difference between the gate and the source of the third P-channel transistor PM33 is less than the critical voltage, the third P-channel transistor PM33 may operate in a saturation region. The voltage difference between the gate and the source of the third P-channel transistor PM33 may be determined by the supply voltage VDD and the second enablement signal EN32. If the supply voltage VDD has a high level (refer to the high supply voltage VDDH illustrated in FIGS. 5 and 6), the second enablement signal generator 321 may generate the second enablement signal EN32 having a voltage level that is sufficient to put the third P-channel transistor PM33 in a linear operation mode corresponding to a linear region. If the supply voltage VDD has a low level (refer to the low supply voltage VDDL illustrated in FIGS. 7 and 8), the second enablement signal generator 321 may generate the second enablement signal EN32 having a voltage level that is sufficient to put the third P-channel transistor PM33 in a saturation operation mode corresponding to a saturation region. In some embodiments, the second enablement signal generator 321 may generate a voltage signal having a voltage level which is within the range of 30% to 70% of the supply voltage VDD. For example, the second enablement signal generator 321 may generate a voltage signal having a voltage level that corresponds to 50% of the supply voltage VDD. An equivalent resistance value of the third P-channel transistor PM33 operating in a saturation region may be higher than an equivalent resistance value of the third P-channel transistor PM33 operating in a linear region.

The sensing circuit 330 may be realized using an inverter structure comprised of a first N-channel transistor NM31 and a fourth P-channel transistor PM34. A gate of the first N-channel transistor NM31 may receive a sensing input signal SA_IN through a sensing input line 302. The sensing input line 302 may be coupled to the first node node_C. A source of the first N-channel transistor NM31 may be coupled to the ground voltage terminal. A drain of the first N-channel transistor NM31 may be coupled to a drain of the fourth P-channel transistor PM34. A source of the fourth P-channel transistor PM34 may be coupled to the supply voltage line 301 that transmits the supply voltage VDD. A gate of the fourth P-channel transistor PM34 may be grounded through the ground voltage terminal. Thus, the fourth P-channel transistor PM34 may be always turned on regardless of the sensing input signal SA_IN. The drains of the first N-channel transistor NM31 and the fourth P-channel transistor PM34 may be coupled to a sensing output line 203 through which a sensing output signal SA_OUT is outputted.

The first N-channel transistor NM31 may have a transconductance (gm) which is higher than a transconductance (gm) of the fourth P-channel transistor PM34. That is, a channel length of the first N-channel transistor NM31 may be less than a channel length of the fourth P-channel transistor PM34, or a channel width of the first N-channel transistor NM31 may be greater than a channel width of the fourth P-channel transistor PM34. Since the transconductance (gm) of the first N-channel transistor NM31 is higher than the transconductance (gm) of the fourth P-channel transistor PM34, a resistance value of the first N-channel transistor NM31 may be less than a resistance value of the fourth P-channel transistor PM34 if both of the first N-channel transistor NM31 and the fourth P-channel transistor PM34 are turned on. Thus, if both of the first N-channel transistor NM31 and the fourth P-channel transistor PM34 are turned on, the sensing output signal SA_OUT outputted through the sensing output line 203 may have a low voltage level (i.e., a logic "low" level) which is close to the ground voltage.

Figure 10:
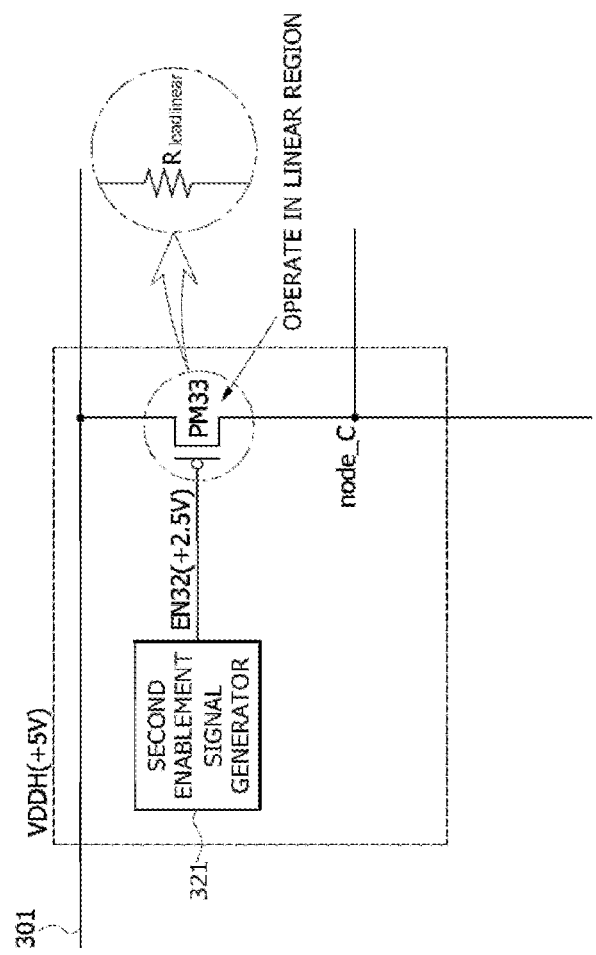
FIG. 10 illustrates a resistive load portion of the nonvolatile memory device illustrated in FIG. 9 for illustrating an equivalent resistance of a resistive load element according to a second enablement signal when a high supply voltage is applied to the nonvolatile memory device.
Figure 11:
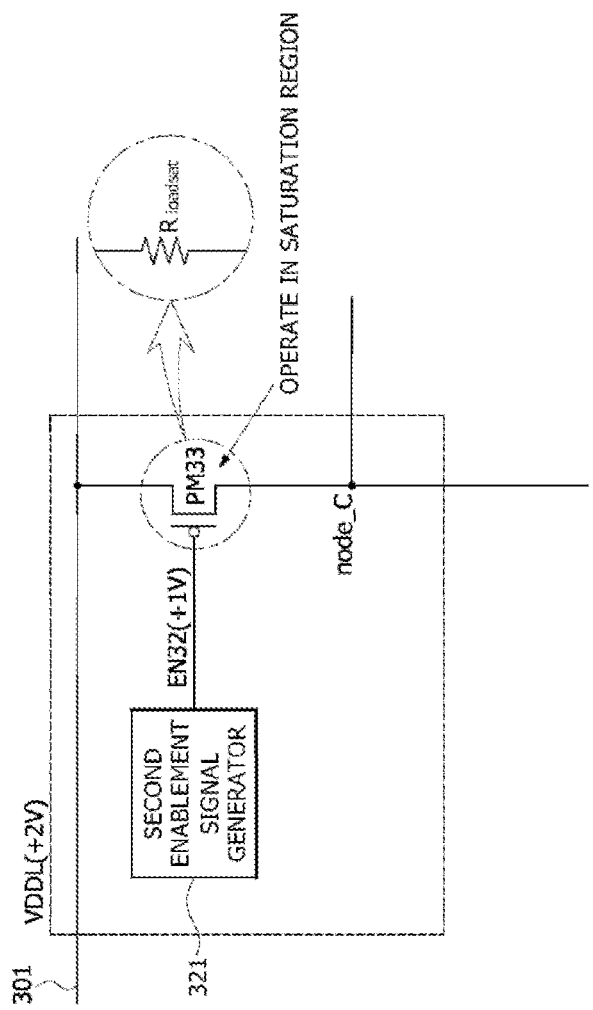
FIG. 11 illustrates a resistive load portion of the nonvolatile memory device illustrated in FIG. 9 for illustrating an equivalent resistance of a resistive load element according to a second enablement signal when a low supply voltage is applied to the nonvolatile memory device.

FIG. 10 illustrates the resistive load portion 320 of the NVM device 300 illustrated in FIG. 9 for illustrating an equivalent resistance of the resistive load element PM33 according to the second enablement signal EN32 when a high supply voltage VDDH is applied to the NVM device 300, and FIG. 11 illustrates the resistive load portion 320 of the NVM device 300 illustrated in FIG. 9 for illustrating an equivalent resistance of the resistive load element PM33 according to the second enablement signal EN32 when a low supply voltage VDDL is applied to the NVM 300. In the following descriptions of FIGS. 10 and 11, it is assumed that the second enablement signal generator 321 generates the second enablement signal EN32 having a voltage level that corresponds to approximately 50% of the supply voltage VDD (corresponding to the high supply voltage VDDH or the low supply voltage VDDL). As illustrated in FIG. 10, if the high supply voltage VDDH of +5 volts is supplied to the NVM device 300, the second enablement signal EN32 generated from the second enablement signal generator 321 may have a voltage level of +2.5 volts. This second enablement signal EN32 may be applied to the gate of the third P-channel transistor PM33. Thus, a voltage difference between the gate and the source of the third P-channel transistor PM33 may be 2.5 volts. This voltage difference of 2.5 volts may allow the third P-channel transistor PM33 to operate in a linear region. The third P-channel transistor PM33 operating in a linear region may function as an equivalent resistor $R_{loadlinear}$ having a relatively low resistance value. In contrast, as illustrated in FIG. 11, if the low supply voltage VDDL of +2 volts is supplied to the NVM device 300, the second enablement signal EN32 generated from the second enablement signal generator 321 may have a voltage level of +1 volt. This second enablement signal EN32 may be applied to the gate of the third P-channel transistor PM33. Thus, a voltage difference of 1 volt may occurs between the gate and the source of the third P-channel transistor PM33. The third P-channel transistor PM33 may operate in a saturation region due to the voltage difference of 1 volt between the gate and the source of the third P-channel transistor PM33. The third P-channel transistor PM33 operating in a saturation region may function as an equivalent resistor $R_{loadsat}$ having a relatively high resistance value. As described with reference to FIGS. 10 and 11, the third P-channel transistor PM33 acting as a resistive load element may function as the equivalent resistor $R_{loadlinear}$ having a relatively low resistance value if the high supply voltage VDDH is supplied to the NVM device 300, and the third P-channel transistor PM33 may function as the equivalent resistor $R_{loadsat}$ having a relatively high resistance value if the low supply voltage VDDL is supplied to the NVM device 300.

Figure 12:
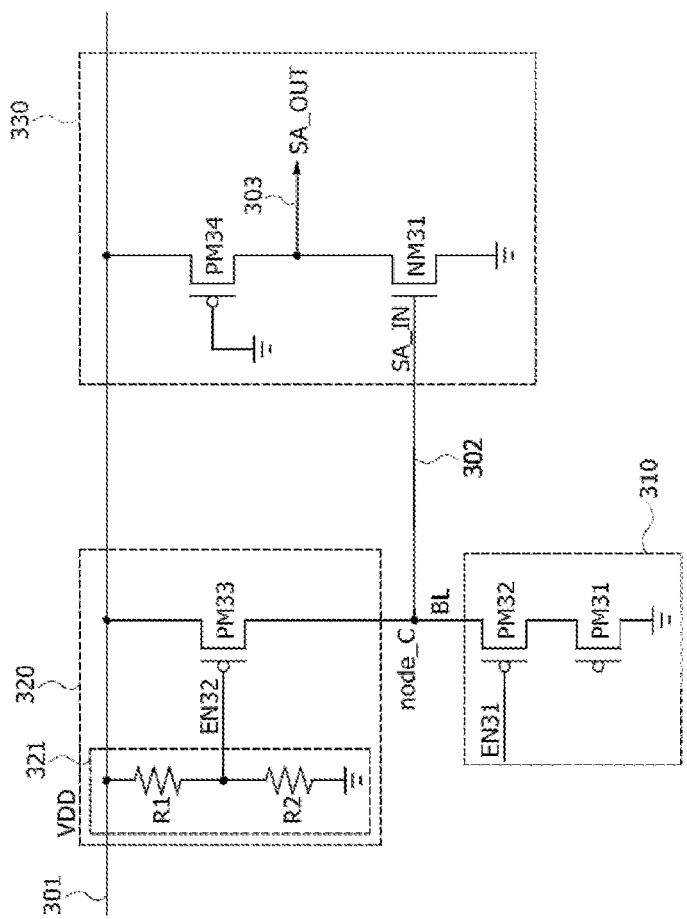
FIG. 12 is a circuit diagram of the nonvolatile memory device illustrated in FIG. 9 for illustrating a voltage division bias circuit constituting a second enablement signal generator of the nonvolatile memory device.

FIG. 12 is a circuit diagram of the NVM device 300 illustrated in FIG. 9 for illustrating a voltage division bias circuit constituting the second enablement signal generator 321 of the NVM device 300. Referring to FIG. 12, the same reference numerals or designators as used in FIG. 9 denote the same elements. Thus, descriptions to the same elements as set forth with reference to FIG. 9 will be omitted or briefly mentioned hereinafter to avoid duplicate explanation. Referring to FIG. 12, the second enablement signal generator 321 may be realized using a voltage division bias circuit comprised of a first resistor R1 and a second resistor R2. The first and second resistors R1 and R2 may be coupled in series between the supply voltage line 301 and the ground voltage terminal. An output line of the second enablement signal generator 321 may be coupled to a node between the first and second resistors R1 and R2. A voltage level of the second enablement signal EN32 outputted through the output line of the second enablement signal generator 321 may be determined by the supply voltage VDD, a resistance value of the first resistor R1, and a resistance value of the second resistor R2. That is, if "r1" and "r2" respectively denote resistance values of the first and second resistors R1 and R2, the voltage level of the second enablement signal EN32 may be calculated by an equation of "(r2/(r1+r2))× VDD". For example, if the first and second resistors R1 and R2 have the same resistance value, the second enablement signal EN32 may have a voltage level corresponding to a half of the supply voltage VDD.

Figure 13:
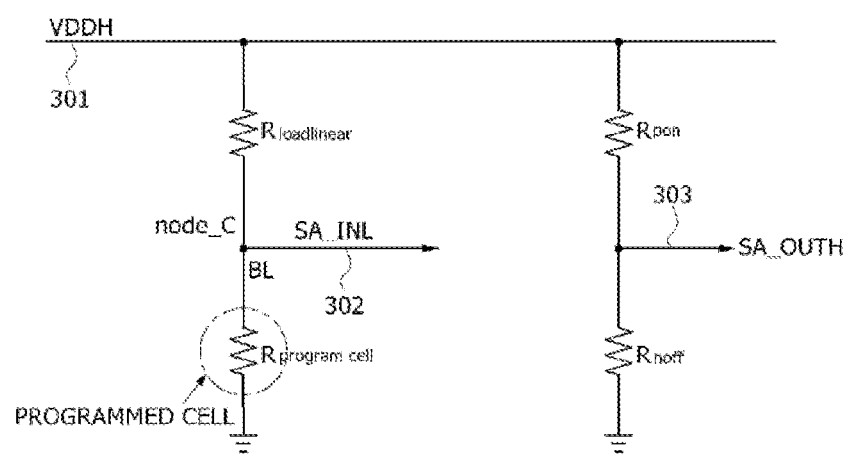
FIG. 13 is an equivalent circuit diagram of the nonvolatile memory device illustrated in FIG. 9 for illustrating a read operation of a programmed cell transistor included in the nonvolatile memory device when a high supply voltage is applied to the nonvolatile memory device.

FIG. 13 is an equivalent circuit diagram of the NVM device 300 illustrated in FIG. 9 for illustrating a read operation of a programmed cell transistor included in the NVM device 300 when a high supply voltage VDDH is applied to the NVM device 300. Referring FIGS. 9 and 13, in order to execute a read operation of the NVM device 300, a low signal having a voltage level close to or equal to the ground voltage may be provided as the first enablement signal EN31 to turn on the second P-channel transistor PM32 acting as a selection transistor. The NVM cell 310 coupled between the first node node_C and the ground voltage terminal may be expressed as a first equivalent resistor $R_{program\ cell}$. The second enablement signal generator 321 may generate the second enablement signal EN32 having a voltage level that is sufficient to put the third P-channel transistor PM33 in a linear operation mode corresponding to a linear region. Thus, the third P-channel transistor PM33 coupled between the supply voltage line 301 and the first node node_C may be expressed as a second equivalent resistor $R_{loadlinear}$. Since the first P-channel transistor PM31 has a programmed status corresponding to an on-cell status, the first equivalent resistor $R_{program\ cell}$ may have a relatively low resistance value as compared with the second equivalent resistor $R_{loadlinear}$. Thus, the first node node_C may have a voltage level which is close to the ground voltage. The voltage level of the first node node_C may provide a low sensing input signal SA_INL having a low level, and the low sensing input signal SA_INL may be applied to the gate of the first N-channel transistor NM31 of the sensing circuit 330 through the sensing input line 302.

As the low sensing input signal SA_INL having a low level is applied to the gate of the first N-channel transistor NM31, the first N-channel transistor NM31 may be turned off. Thus, the first N-channel transistor NM31 of the sensing circuit 330 may be expressed as a third equivalent resistor $R_{noff}$ having a high resistance value. Since the fourth P-channel transistor PM34 of the sensing circuit 330 is always turned on regardless of the low sensing input signal SA_INL having a low level, the fourth P-channel transistor PM34 may be expressed as a fourth equivalent resistor $R_{pon}$ having a low resistance value. Since the fourth equivalent resistor $R_{pon}$ has a relatively low resistance value as compared with the third equivalent resistor $R_{noff}$, a high sensing output signal SA_OUTH having a high level close to the high supply voltage VDDH may be outputted through the sensing output line 303 which is branched from a node between the third and fourth equivalent resistors $R_{noff}$ and $R_{pon}$. Accordingly, the first P-channel transistor PM31 acting as a cell transistor of the NVM cell 310 may be regarded as a programmed cell transistor.

Figure 14:
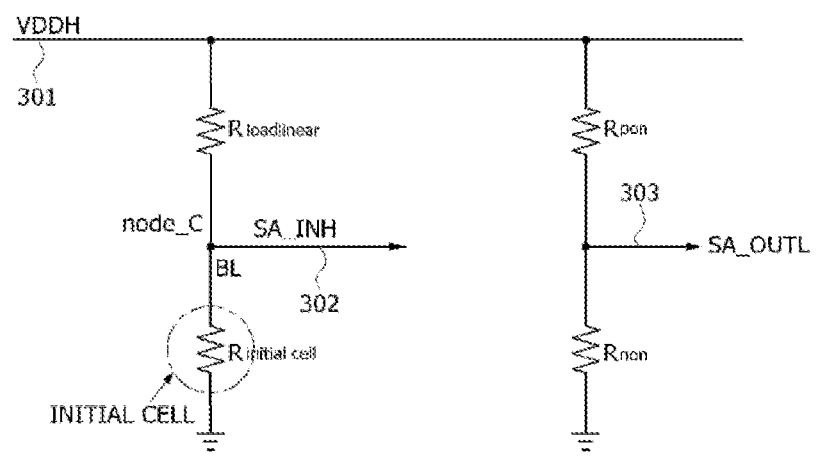
FIG. 14 is an equivalent circuit diagram of the nonvolatile memory device illustrated in FIG. 9 for illustrating a read operation of an initial cell transistor included in the nonvolatile memory device when a high supply voltage is applied to the nonvolatile memory device.

FIG. 14 is an equivalent circuit diagram of the NVM device 300 illustrated in FIG. 9 for illustrating a read operation of an initial cell transistor included in the NVM device 300 when a high supply voltage VDDH is applied to the NVM device 300. Referring FIGS. 9 and 14, in order to execute a read operation of the NVM device 300, a low signal having a voltage level close to or equal to the ground voltage may be provided as the first enablement signal EN31 to turn on the second P-channel transistor PM32 acting as a selection transistor. The NVM cell 310 coupled between the first node node_C and the ground voltage terminal may be expressed as a first equivalent resistor $R_{initial\ cell}$. The second enablement signal generator 321 may generate the second enablement signal EN32 having a voltage level that is sufficient to put the third P-channel transistor PM33 in a linear operation mode corresponding to a linear region. Thus, the third P-channel transistor PM33 coupled between the supply voltage line 301 and the first node node_C may be expressed as a second equivalent resistor $R_{loadlinear}$. Since the first P-channel transistor PM31 has an initial status corresponding to an off-cell status, the first equivalent resistor $R_{initial\ cell}$ may have a relatively high resistance value as compared with the second equivalent resistor $R_{loadlinear}$. Thus, the first node node_C may have a voltage level which is close to the high supply voltage VDDH. The voltage level of the first node node_C may provide a high sensing input signal SA_INH having a high level, and the high sensing input signal SA_INH may be applied to the gate of the first N-channel transistor NM31 of the sensing circuit 330 through the sensing input line 302.

As the high sensing input signal SA_INH having a high level is applied to the gate of the first N-channel transistor NM31, the first N-channel transistor NM31 may be turned on. Thus, the first N-channel transistor NM31 of the sensing circuit 330 may be expressed as a third equivalent resistor R non having a relatively low resistance value. Since the fourth P-channel transistor PM34 of the sensing circuit 330 is always turned on regardless of the high sensing input signal SA_INH having a high level, the fourth P-channel transistor PM34 may be expressed as a fourth equivalent resistor $R_{pon}$. Although both of the first N-channel transistor NM31 and the fourth P-channel transistor PM34 are turned on, a resistance value of the third equivalent resistor $R_{non}$ may be lower than a resistance value of the fourth equivalent resistor R pon because a transconductance of the first N-channel transistor NM31 is higher than a transconductance of the fourth P-channel transistor PM34. Thus, a low sensing output signal SA_OUTL having a low level close to the ground voltage rather than the high supply voltage VDDH may be outputted through the sensing output line 303 which is branched from a node between the third and fourth equivalent resistors $R_{non}$ and $R_{pon}$. Accordingly, the first P-channel transistor PM31 acting as a cell transistor of the NVM cell 310 may be regarded as an initial cell transistor.

Figure 15:
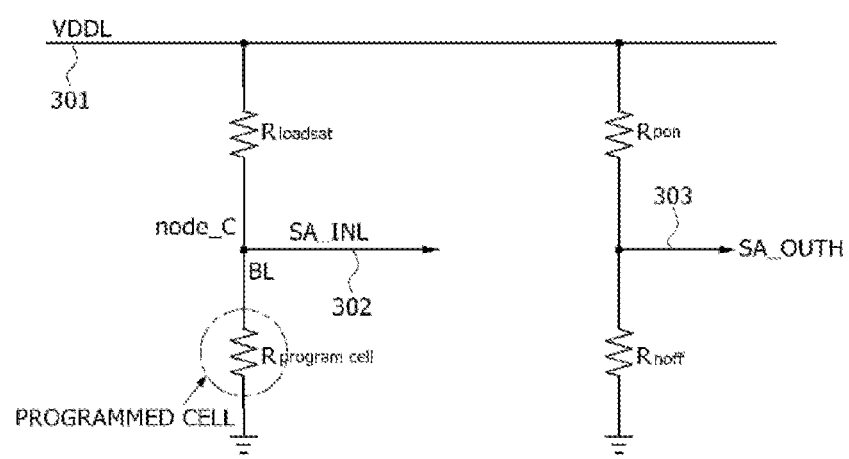
FIG. 15 is an equivalent circuit diagram of the nonvolatile memory device illustrated in FIG. 9 for illustrating a read operation of a programmed cell transistor included in the nonvolatile memory device when a low supply voltage is applied to the nonvolatile memory device.

FIG. 15 is an equivalent circuit diagram of the NVM device 300 illustrated in FIG. 9 for illustrating a read operation of a programmed cell transistor included in the NVM device 300 when a low supply voltage VDDL is applied to the NVM device 300. Referring FIGS. 9 and 15, in order to execute a read operation of the NVM device 300, a low signal having a voltage level close to or equal to the ground voltage may be provided as the first enablement signal EN31 to turn on the second P-channel transistor PM32 acting as a selection transistor. The NVM cell 310 coupled between the first node node_C and the ground voltage terminal may be expressed as a first equivalent resistor $R_{program\ cell}$. The second enablement signal generator 321 may generate the second enablement signal EN32 having a voltage level that is sufficient to put the third P-channel transistor PM33 in a saturation operation mode corresponding to a saturation region. Thus, the third P-channel transistor PM33 coupled between the supply voltage line 301 and the first node node_C may be expressed as a second equivalent resistor $R_{loadsat}$. Since the first P-channel transistor PM31 has a programmed status corresponding to an on-cell status, the first equivalent resistor $R_{program\ cell}$ may have a relatively low resistance value as compared with the second equivalent resistor $R_{loadsat}$. In addition, since the third P-channel transistor PM33 operates in a saturation region, a resistance value of the second equivalent resistor $R_{loadsat}$ at the low supply voltage VDDL may be higher than a resistance value of the third P-channel transistor PM33 (i.e., the second equivalent resistor $R_{loadlinear}$) at the high supply voltage VDDH. Thus, a ratio of a resistance value of the second equivalent resistor $R_{loadsat}$ to a resistance value of the first equivalent resistor $R_{program\ cell}$ at the low supply voltage VDDL may be higher than a ratio of a resistance value of the second equivalent resistor $R_{loadlinear}$ to a resistance value of the first equivalent resistor $R_{program\ cell}$ at the high supply voltage VDDH. Accordingly, a read margin of the first P-channel transistors PM31 having a programmed status may be more improved even though the supply voltage VDD is lowered. The first node node_C may have a voltage level which is close to the ground voltage. The voltage level of the first node node_C may provide a low sensing input signal SA_INL having a low level, and the low sensing input signal SA_INL may be applied to the gate of the first N-channel transistor NM31 of the sensing circuit 330 through the sensing input line 302.

As the low sensing input signal SA_INL having a low level is applied to the gate of the first N-channel transistor NM31, the first N-channel transistor NM31 may be turned off. Thus, the first N-channel transistor NM31 of the sensing circuit 330 may be expressed as a third equivalent resistor $R_{noff}$ having a high resistance value. Since the fourth P-channel transistor PM34 of the sensing circuit 330 is always turned on regardless of the low sensing input signal SA_INL having a low level, the fourth P-channel transistor PM34 may be expressed as a fourth equivalent resistor $R_{pon}$ having a low resistance value. Since the fourth equivalent resistor $R_{pon}$ has a relatively low resistance value as compared with the third equivalent resistor $R_{noff}$, a high sensing output signal SA_OUTH having a high level close to the low supply voltage VDDL may be outputted through the sensing output line 303 which is branched from a node between the third and fourth equivalent resistors $R_{noff}$ and $R_{pon}$. Accordingly, the first P-channel transistor PM31 acting as a cell transistor of the NVM cell 310 may be regarded as a programmed cell transistor.

Figure 16:
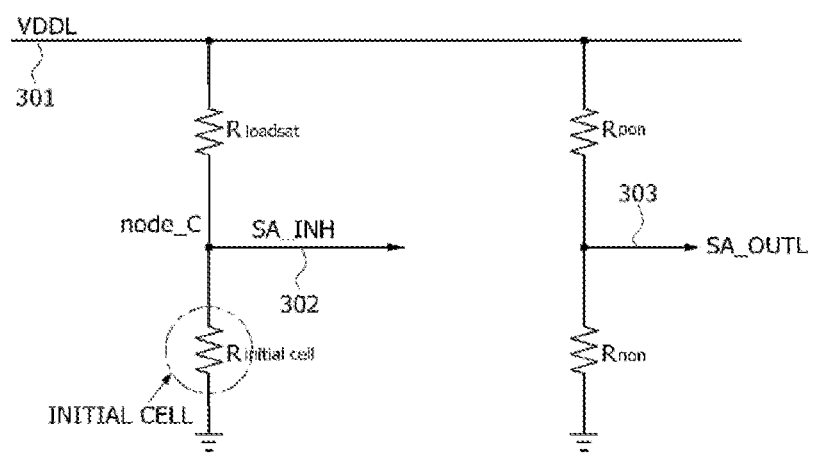
FIG. 16 is an equivalent circuit diagram of the nonvolatile memory device illustrated in FIG. 9 for illustrating a read operation of an initial cell transistor included in the nonvolatile memory device when a low supply voltage is applied to the nonvolatile memory device.

FIG. 16 is an equivalent circuit diagram of the NVM device 300 illustrated in FIG. 9 for illustrating a read operation of an initial cell transistor included in the NVM device 300 when a low supply voltage VDDL is applied to the NVM device 300. Referring FIGS. 9 and 16, in order to execute a read operation of the NVM device 300, a low signal having a voltage level close to or equal to the ground voltage may be provided as the first enablement signal EN31 to turn on the second P-channel transistor PM32 acting as a selection transistor. The NVM cell 310 coupled between the first node node_C and the ground voltage terminal may be expressed as a first equivalent resistor $R_{initial\ cell}$. The second enablement signal generator 321 may generate the second enablement signal EN32 having a voltage level that is sufficient to put the third P-channel transistor PM33 in a saturation operation mode corresponding to a saturation region. Thus, the third P-channel transistor PM33 coupled between the supply voltage line 301 and the first node node_C may be expressed as a second equivalent resistor $R_{loadsat}$. Since the first P-channel transistor PM31 has an initial status corresponding to an off-cell status, the first equivalent resistor $R_{initial\ cell}$ may have a relatively high resistance value as compared with the second equivalent resistor $R_{loadsat}$. Thus, the first node node_C may have a voltage level which is close to the low supply voltage VDDL. The voltage level of the first node node_C may provide a high sensing input signal SA_INH having a high level, and the high sensing input signal SA_INH may be applied to the gate of the first N-channel transistor NM31 of the sensing circuit 330 through the sensing input line 302.

As the high sensing input signal SA_INH having a high level is applied to the gate of the first N-channel transistor NM31, the first N-channel transistor NM31 may be turned on. Thus, the first N-channel transistor NM31 of the sensing circuit 330 may be expressed as a third equivalent resistor $R_{non}$ having a relatively low resistance value. Since the fourth P-channel transistor PM34 of the sensing circuit 330 is always turned on regardless of the high sensing input signal SA_INH having a high level, the fourth P-channel transistor PM34 may be expressed as a fourth equivalent resistor $R_{pon}$ having a relatively low resistance value. Although both of the first N-channel transistor NM31 and the fourth P-channel transistor PM34 are turned on, a resistance value of the third equivalent resistor $R_{non}$ may be lower than a resistance value of the fourth equivalent resistor $R_{pon}$ because a transconductance of the first N-channel transistor NM31 is higher than a transconductance of the fourth P-channel transistor PM34. Thus, a low sensing output signal SA_OUTL having a low level close to the ground voltage rather than the low supply voltage VDDL may be outputted through the sensing output line 303 which is branched from a node between the third and fourth equivalent resistors $R_{non}$ and $R_{pon}$. Accordingly, the first P-channel transistor PM31 acting as a cell transistor of the NVM cell 310 may be regarded as an initial cell transistor.

According to the embodiments described above, a read margin of a programmed cell of an NVM device may be improved even at a low supply voltage. According to the embodiments described above, a read margin of an initial cell of the NVM device may also be improved at a high supply voltage.

The embodiments of the present disclosure have been disclosed above for illustrative purposes. Those of ordinary skill in the art will appreciate that various modifications, additions, and substitutions are possible, without departing from the scope and spirit of the present disclosure as disclosed in the accompanying claims.

What is claimed is:
1. A nonvolatile memory (NVM) device comprising:
a nonvolatile memory cell; and
a sensing circuit coupled to a bit line of the nonvolatile memory cell, wherein the sensing circuit is realized using an inverter comprised of a P-channel transistor coupled to a supply voltage line and an N-channel transistor coupled to a ground voltage, and
wherein a gate of the P-channel transistor is coupled to the ground voltage, and
wherein a resistance value of the N-channel transistor is less than a resistance value of the P-channel transistor if both the N-channel transistor and the P-channel transistor are turned on.

2. The NVM device of claim 1, wherein the nonvolatile memory cell is configured to include a cell transistor coupled between the bit line and the ground voltage.

3. The NVM device of claim 1, wherein the nonvolatile memory cell is configured to include a first P-channel transistor having a drain coupled to the ground voltage, a floating gate, and a source.

4. The NVM device of claim 3, wherein the nonvolatile memory cell further includes a selection transistor coupled between the bit line and the first P-channel transistor.

5. The NVM device of claim 4, wherein the selection transistor is realized using a second P-channel transistor having a source coupled to the bit line, a drain coupled to the source of the first P-channel transistor, and a gate to which a first enablement signal is inputted.

6. The NVM device of claim 1, further comprising a resistive load portion coupled between the bit line and the supply voltage line.

7. The NVM device of claim 6, wherein the resistive load portion is realized using a third P-channel transistor having a source coupled to the supply voltage line, a drain coupled to the bit line, and a gate to which a second enablement signal is inputted.

8. The NVM device of claim 7, wherein the third P-channel transistor operates in a linear region or a saturation region according to a voltage level of a supply voltage applied to the supply voltage line and a voltage level of the second enablement signal.

9. The NVM device of claim 7,
wherein the resistive load portion further includes a second enablement signal generator configured to generate the second enablement signal; and
wherein a voltage level of the second enablement signal varies according to a supply voltage applied to the supply voltage line.

10. The NVM device of claim 9,
wherein the second enablement signal is generated to have a voltage level that allows the third P-channel transistor to operate in a linear region when the supply voltage has a high level; and
wherein the second enablement signal is generated to have a voltage level that allows the third P-channel transistor to operate in a saturation region when the supply voltage has a low level.

11. The NVM device of claim 9, wherein the second enablement signal is generated from the second enablement signal generator to have a voltage level which is within the range of 30% to 70% of the supply voltage.

12. The NVM device of claim 11, wherein the second enablement signal is generated to have a voltage level that corresponds to 50% of the supply voltage.

13. The NVM device of claim 9,
wherein the second enablement signal generator is realized using a voltage division bias circuit;

wherein the voltage division bias circuit includes a first resistor and a second resistor which are coupled in series between the supply voltage line and the ground voltage; and wherein the voltage division bias circuit further includes an output line branched from a node between the first and second resistors.

14. The NVM device of claim 13, wherein the first and second resistors have substantially the same resistance value.

15. The NVM device of claim 1, wherein the N-channel transistor has a gate coupled to a sensing input line connected to the bit line, a source coupled to the ground voltage, and a drain coupled to a sensing output line; and wherein a source and a drain of the P-channel transistor are coupled to the supply voltage line and the sensing output line, respectively.

16. The NVM device of claim 15, wherein the N-channel transistor has a transconductance which is higher than a transconductance of the P-channel transistor.

17. The NVM device of claim 16, wherein a channel length of the N-channel transistor is less than a channel length of the P-channel transistor, or a channel width of the N-channel transistor is greater than a channel width of the P-channel transistor.

* * * * *